(12) United States Patent
Wake

(10) Patent No.: US 6,297,071 B1
(45) Date of Patent: Oct. 2, 2001

(54) METHOD OF MAKING PLANAR IMAGE SENSOR COLOR FILTER ARRAYS

(75) Inventor: Ronald W. Wake, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/121,137

(22) Filed: Jul. 22, 1998

(51) Int. Cl.$^7$ ...................................................... H01L 21/77
(52) U.S. Cl. .................................. 438/70; 438/73; 438/75
(58) Field of Search ................................. 438/27, 60, 65, 438/69, 70, 71, 73, 75; 250/208.1, 226

(56) References Cited

U.S. PATENT DOCUMENTS

| | | |
|---|---|---|
| 4,081,277 | 3/1978 | Brault et al. . |
| 4,204,866 | 5/1980 | Horak et al. . |
| 4,247,799 | 1/1981 | Drexhage . |
| 4,307,165 | 12/1981 | Blazey et al. . |
| 4,315,978 | 2/1982 | Hartman . |
| 4,387,146 | 6/1983 | Whitmore . |
| 4,553,153 | 11/1985 | McColgin et al. . |
| 4,764,670 | 8/1988 | Pace et al. . |
| 4,876,167 | 10/1989 | Snow et al. . |
| 5,321,249 | 6/1994 | Nomura . |
| 5,677,202 * | 10/1997 | Hawkins ................................. 437/3 |
| 5,708,264 * | 1/1998 | Hawkins ............................... 250/226 |
| 5,719,074 * | 2/1998 | Hawkins ................................. 438/70 |
| 5,734,190 * | 3/1998 | Hawkins ............................... 257/432 |
| 5,747,790 * | 5/1998 | Shimomura .......................... 250/208.1 |
| 5,889,277 * | 3/1999 | Hawkins ............................. 250/208.1 |

* cited by examiner

*Primary Examiner*—Mary Wilczewski
*Assistant Examiner*—David Goodwin
(74) *Attorney, Agent, or Firm*—Raymond L. Owens

(57) ABSTRACT

A method of making a solid state image sensor having a color filter array with color filter elements having a plurality of different types of colored pixels embedded in a planar surface, the method includes providing a first transparent layer covering the pixels; making the first transparent layer optically planar by chemical mechanical polishing; and uniformly depositing a second transparent etch-stop layer over the first transparent layer. The method further includes uniformly depositing a third support layer over the second transparent etch-stop layer which is made of a different material than the second transparent etch-stop layer; etching openings into the third support layer in regions where color filter elements are desired to be formed; conformably coating a photoresist layer in the openings on the top surface of the second transparent etch-stop layer and on the top surface of the third support layer; patterning the photoresist layer to remove portions of the photoresist layer corresponding to the first type of colored pixels; coating the photoresist layer and the second transparent etch-stop layer in the patterned opening portions with color filter material of the first color type corresponding to the first type of colored pixels; removing the first type of color filter material from positions where it was coated over the photoresist layer.

11 Claims, 8 Drawing Sheets

METHOD OF MAKING PLANAR IMAGE SENSOR COLOR FILTER ARRAYS

FIELD OF THE INVENTION

This invention relates to methods of making planar color filter arrays for solid state image sensors.

BACKGROUND OF THE INVENTION

A solid state imager can be viewed as including a number of laterally offset pixels containing photosensitive regions. Arrays of color filter elements transmitting selected portions of the visible spectrum and placed in registration with the pixels of a solid state imager are well known to the art and can take a variety of forms. Each color filter element transmits a portion of the color spectrum of incident light into the associated pixel of the imager in order to provide the imager with means of color sensitization. All visible image sensors, including linear sensors, can utilize color filters whether or not the photosensitive region occupies the entire pixel area. Typically, the color filter elements are transmissive of a set of primary colors such as red, green and blue or of complementary colors such as cyan, yellow, and magenta and or white. Lens arrays integral to the image sensor, commonly made by thermal deformation of photolithographically defined polymers, are often employed over color filter arrays to direct light rays through color filter elements to the photosensitive regions.

FIG. 1 shows a single pixel 10 of a typical interline image sensor with color filter elements 24a and 24b in registration with a lens 22, photodiode 14 formed in semiconductor substrate 12, gate electrode 16, and light shield 18. The gate electrode and light shield are typically isolated electrically from one another and from the substrate by isolation oxides not shown. A color filter array includes a plurality of color filter elements 24a, 24b, and 24c (not shown), typically provided in a pattern of three or more elements each transmitting a different spectral region. Photodiode 14, semiconductor substrate 12, gate electrode 16, and light shield 18 form semiconductor portion 40 of the imager.

The prior art image sensor with a pixel shown in FIG. 1 has a partially planarizing layer 20a for offsetting the color filter element 24a from photodiodes 14. Conventionally, the partially planarizing layer includes an organic spacer layer spin coated to achieve some degree of planarization in order to provide simpler processing conditions for deposition of the color filter array, such as the color filter arrays described in Nomura, U.S. Pat. No. 5,321,249, typically coated from organic materials. Partially planarizing layer 20a enables better process control of the thickness of the color filter elements, essential in controlling the spectral transmission characteristics. The use and limitations of such planarizing layers in optically active solid state image sensors is taught by McColgin, U.S. Pat. No. 4,553,153 for a polymerizable monomer. Upper planarizing layer 20b in FIG. 1 is typically used to space lens 22 away from photodiode 14 and partially compensates for irregular topography of conventional color filter elements.

As shown in FIG. 1, prior art color filter arrays suffer to some degree from lack of planarity, due to both lack of planarity of the substrate on which they are formed (region 60 of FIG. 1 and FIGS. 2A and 2B) and lack of planarity of the color filter elements relative to one another (region 62 of FIG. 1 and FIGS. 2A and 2B). Lack of planarity of the substrate produces variations in the thickness of the color filter elements coated on the substrates, which in turn causes local differences in the optical transmission characteristics within each element. Lack of planarity between color filter elements (region 62 of FIG. 1 and of FIGS. 2A and 2B) also results in inter-pixel nonuniformities and in addition causes unwanted light piping and color mixing in regions where a subsequently defined color filter element overlaps a previously defined color filter element. Hartman, U.S. Pat. No. 4,315,978, teaches a method of making color filter arrays in which color filter elements are formed by creating dyeable islands separated by dye impermeable polymers. Neighboring color filter elements, however, overlap to some degree, altering spectral transmission characteristics of color filter elements, and the process typically relies on mask-to-mask alignment accuracy, thereby reducing process latitude. Spectral characteristics are similarly difficult to control, particularly if the pixel size is small, because the area of misalignment must be reduced with pixel size to maintain adequate color resolution. In addition, the overlapping regions make subsequent coatings difficult to coat smoothly.

Various approaches have been undertaken to improve the planarity of the color filter arrays and the substrates on which they are formed, but none has been fully satisfactory. Nomura, U.S. Pat. No. 5,321,249, relies on short spin coating of color filter materials which are to some extent self-planarizing. When the materials for the second or the third color filter elements are coated, this technique greatly reduces the thickness of the spun-on material left over the previously deposited color filter elements (region 62 of FIG. 2B) because the previously deposited elements are topographically high, as is well known in the art of spin-on planarization. However, not all the material is removed and an additional spin coating of planarizing material is necessary to reduce the surface asperities while not completely eliminating them, again due to the use of spin coating techniques. Horak, U.S. Pat. No. 4,204,866, teaches a method of making color filter elements in which a single mordant layer is dyed through openings in the photoresist, the process being repeated using dyes of different colors to provide side-by-side color filter elements. However, the color filter elements are not self aligned, so that the process is sensitive to mask to mask misalignment tolerances. Also, the mordant swells when dyed, as is well known in the art, so that the surface of the single mordant layer becomes non-planar. Also the lateral diffusion of the dyes is too large for very small pixels, being about the thickness of the mordant layer in all directions. Thus, for typical mordant thicknesses of about one micron the dyed area would be expanded by about 2 microns in each dimension of the feature.

Brault, U.S. Pat. No. 4,081,277 teaches repeated thermal dye transfer into a receiving layer using a photoresist mask, but this method also suffers from poor lateral definition of the dye and has not found use in small pixels. Drexhage, U.S. Pat. No. 4,247,799, discloses a single dyed polymer layer that is photobleachable, so that in principal regions of different colors can be formed by optical exposure at different wavelengths, but the edges of the color filter elements are not abruptly defined by this process due to light scatter and beam focus at the scale of a few tenths of a micron. This method has not found acceptance due to the need for special exposure equipment and to the difficulty of finding dyes which are both photobleachable and whose spectral properties are optimal for imagers. Pace and Blood, U.S. Pat. No. 4,764,670, discuss a two layer subtractive color system which provides precise control of density and hue and reduces the number of colors needed in each layer. Although their schematic illustrations indicate perfect registration of the color filter elements, no method is provided for achieving perfect registration, there being still a need for photolithographic alignment to define the lateral extent of the first and the second dyed layer and their overlap, nor is mordant swelling prevented. While this technique is advantageous for large pixel sizes, lack of planarity is disadvantageous for small image sensors, for example for pixels less than 10 microns in size. Snow et al, U.S. Pat. No. 4,876,167, describes a variety of photo-crosslinkable mordants to enable deposition of cLyes in specific regions of a mordant which have been exposed optically, but these materials also suffer from lack of adequate spatial resolution residual dye instability, and from swelling of the mordant.

Any method which relies on the sequential definition of the various colors in a color filter array will suffer some misalignment of those colors. The extent of this misalignment will depend on the sophistication of the equipment used. The more sophisticated equipment will allow better alignment, however, it is more costly and operates more slowly. Blazey, U.S. Pat. No. 4,307,165, and Whitmore, U.S. Pat. No. 4,387,146 disclose the confinement of dyes in a matrix of pre-formed microvessels as a means of preventing image distortion by dye diffusion. However, this prior art does not address the need for controllable thickness for the color filter elements in a color filter array used for electronic imaging applications.

SUMMARY OF THE INVENTION

It is an object of this invention to provide a color filter array for a solid state imager which reduces or eliminates the problems cited above by permitting all color filter elements of the array to have entirely coplanar top and bottom surfaces with no overlap and with minimal gaps or no gaps between adjacent elements.

It is another object of this invention to provide a method of making such an array which is substantially independent of the materials from which the array is formed.

A still further object of the invention is to provide a method of making color filter arrays wherein the pixels are accurately aligned.

These objects are achieved in a method of making a solid state image sensor having a color filter array with color filter elements having a plurality of different types of colored pixels embedded in a planar surface, the method comprising the steps of:

(a) providing a semiconductor substrate having spaced image pixels with a first transparent layer covering the pixels;.

(b) making the first transparent layer optically planar by chemical mechanical polishing;

(c) uniformly depositing a second transparent etch-stop layer over the first transparent layer;

(d) uniformly depositing a third support layer over the second transparent etch-stop layer which is made of a different material than the second transparent etch-stop layer;

(e) etching openings into the third support layer in regions where color filter elements are desired to be formed; and (f) sequentially filling each opening with one of two or more colorants to form the color filter array.

An advantage of image sensors made in accordance with this invention is that the gap between color filter elements can be minimal and there is no overlap between color filter elements.

Another advantage is that the color filter elements are pre-aligned to one another so that mask to mask misalignments do not degrade performance or yield.

Another advantage is that the depth each color filter element is the same and controllable.

A still further advantage is that the surface upon which the color filter array is disposed is rendered optically planar so that light rays are refracted only as expected from an ideal dielectric interface.

Another advantage is that substantially identical processes may be used to make arrays from a variety of materials.

A feature of image sensors made in accordance with this invention is that the top surface of the color filter array can be entirely planar.

Another feature of image sensors made in accordance with this invention is that the number of critical alignment steps is reduced which results in higher yield, faster processing, and reduced need for ex,pensive alignment tools. Processing of image sensors with this invention is further improved by requiring only one plasma etch step to define openings for all of the color elements.

DETAILED DESCRIPTION OF THE PREFERRED EMBODIMENTS

In a preferred embodiment of the present invention, illustrated in FIGS. 3A–3K, a method is provided by which a fully planar color filter array of contiguous color filter elements is embedded in a planarized support layer, the contiguous color filter elements having no regions of overlap. This method is advantageous in that the resulting color filter elements :.re planar and of uniform thickness. A variety of color filter layers may used to provide color filter elements.

Figure 1:
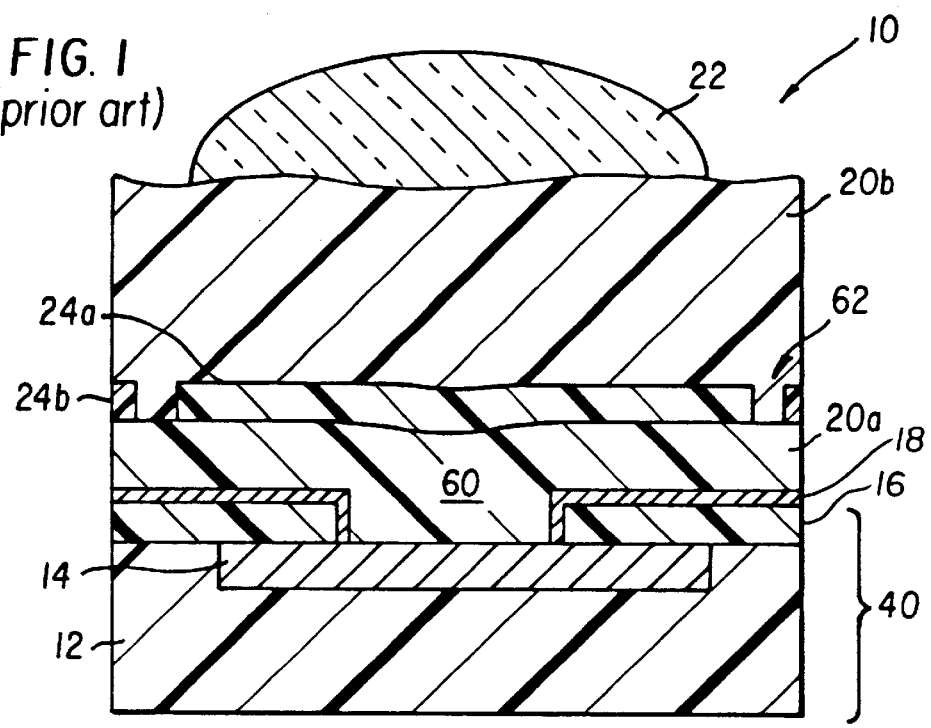
FIG. 1 depicts a partially schematic cross-sectional view of a prior art image sensor.
Figure 2A:
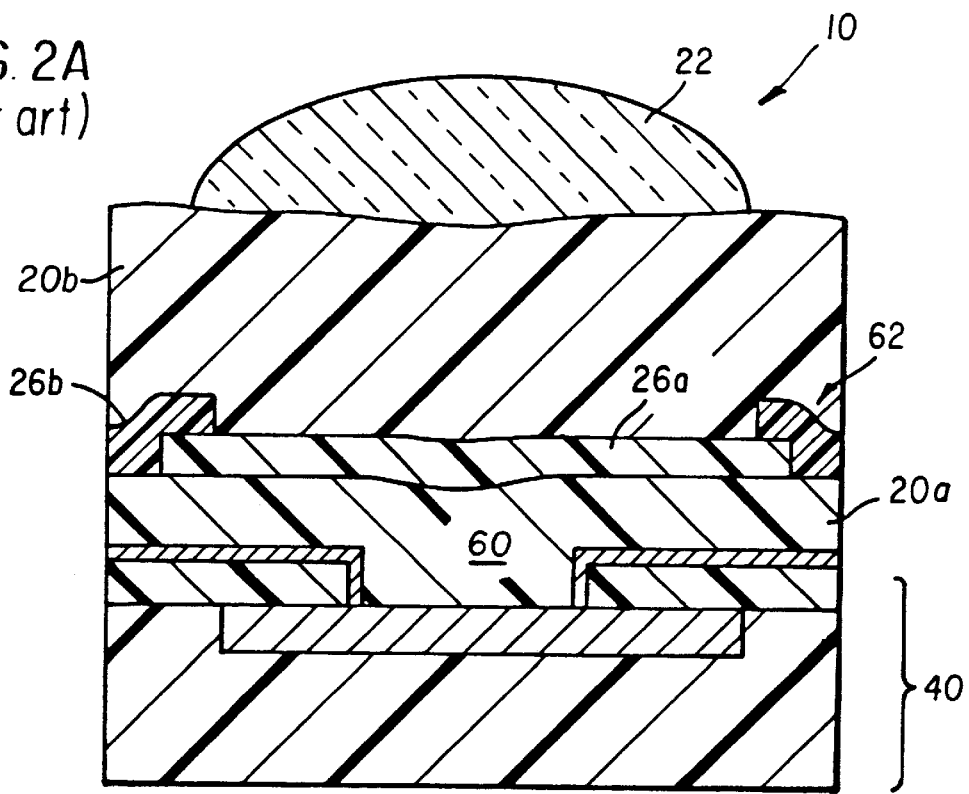
FIGS. 2A–2B depict partially schematic cross-sectional view of prior art image sensor.
Figure 2B:
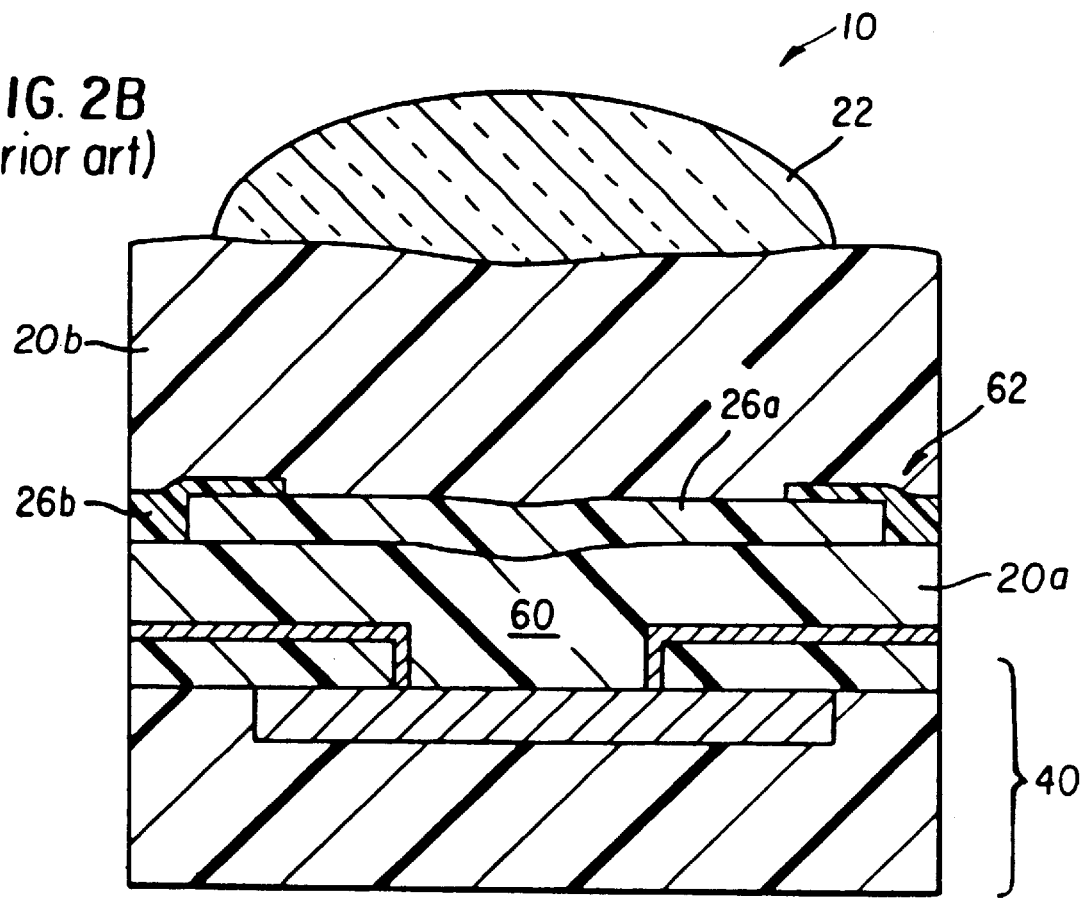
Figure 3A:
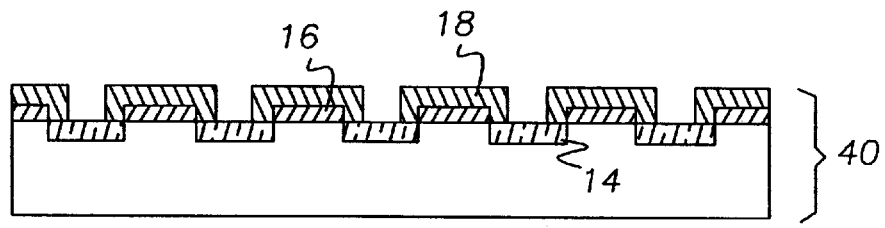
FIGS. 3A–3K show cross-sectional views of various stages of making a color filter array in accordance with this invention.
Figure 3B:
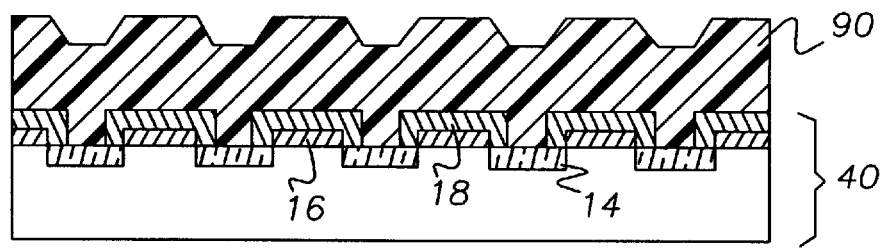
Figure 3C:
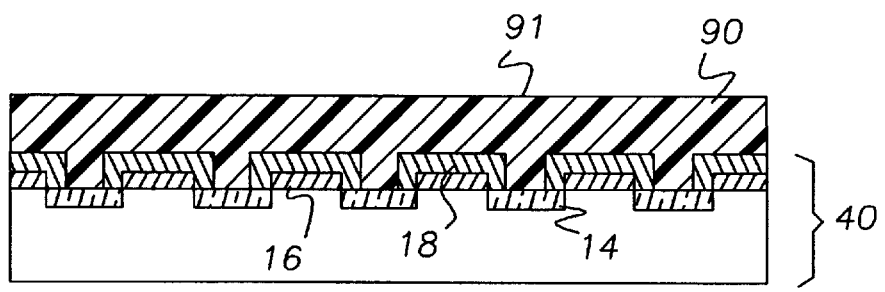
Figure 3D:
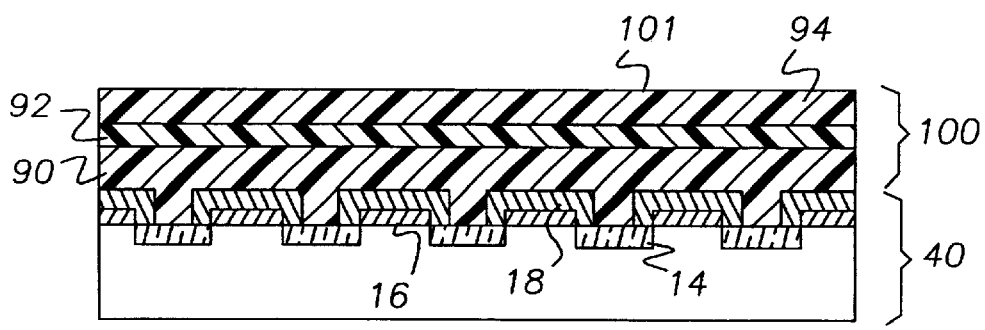

Referring to FIG. 3A, semiconductor portion 40, comprising photosensitive regions 14, electrodes 16, and light-shields 18 is shown as representative of the typical elements of the semiconductor portion of a solid state imager. It is desired to provide an embedded, planar color filter array 150 (FIG. 3K) in a support layer 100 (FIGS. 3D–3K) overlying semiconductor portion 40 and in registration with photosensitive regions 14. In accordance with the present invention, this array is made by first providing support layer 100, preferably in the form of a trilayer structure consisting of a lower transparent layer 90 (FIG. 3B), a transparent etch-stop layer 92 (FIG. 3D), and an upper support layer 94 (FIG. 3D). Lower transparent layer 90 is preferably an oxide deposited by chemical vapor deposition; etch-stop layer 92 is preferably a thin layer of nitride, polysilicon, or diamond-like carbon deposited by plasma enhanced CVD; and upper support layer 94 is preferably an oxide deposited by chemical vapor deposition. Lower transparent layer 90 is shown deposited in FIG. 3B to a thickness sufficient to cover the topography of semiconductor portion 40, typically in the range of one half to two microns. As shown in FIG. 3C, lower transparent layer 90 is planarized optically flat, preferably by chemical mechanical polishing, so that light rays directed toward optically planar surface 91 are refracted as expected for an ideal planar dielectric surface. Etch-stop layer 92, typically of thickness less than 500 Å, is shown uniformly deposited in FIG. 3D. Upper support layer 94, typically of thickness 0.1 to 2.0 micron, is also shown in FIG. 3I). The thickness of upper support layer 94 is chosen to be the desired thickness of the color filter elements. A feature of the present invention is that etch-stop layer 92, upper support layer 94, and surface 101 (FIG. 3D) are optically planar as deposited, because they have been deposited uniformly on optically planar surface 91, as shown in FIG. 3D.

Figure 3E:
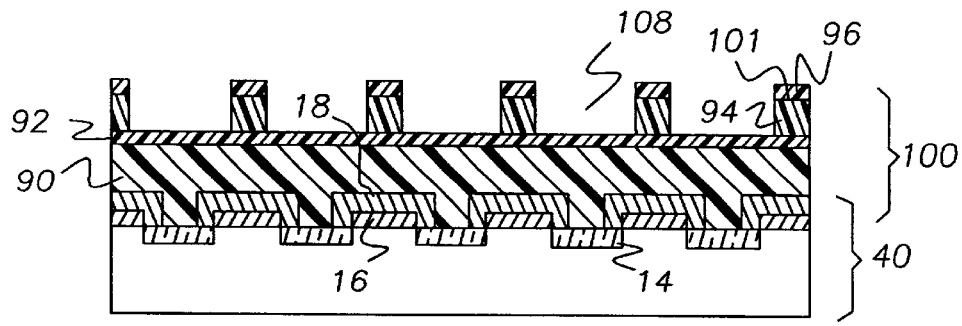

Support layer 100 with surface 101 is shown in FIG. 3E after the steps of patterning conventional photoresist 96 in registration with photosensitive regions 14 in semiconductor portion 40 and after removing, preferably by reactive ion etching, upper support layer 94, the etch stopping automatically on etch-stop layer 92, to form openings 108.

Figure 3F:
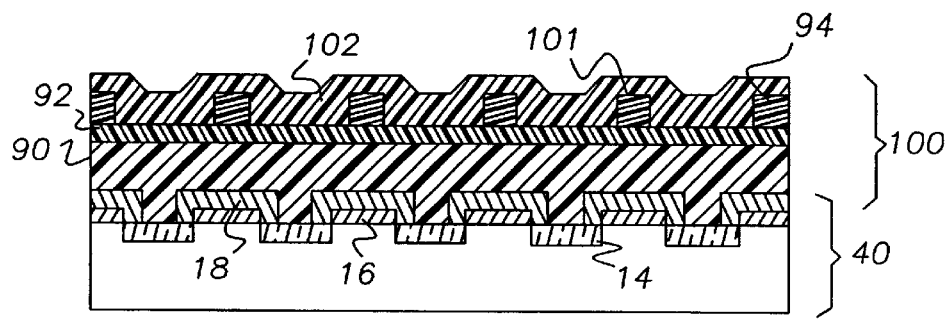
Figure 3G:
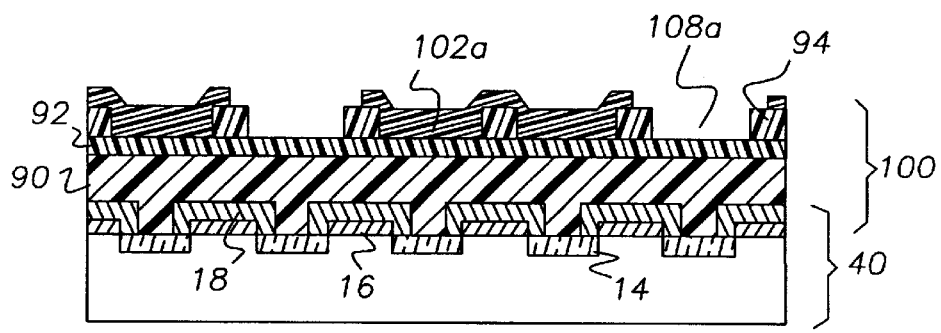
Figure 3H:
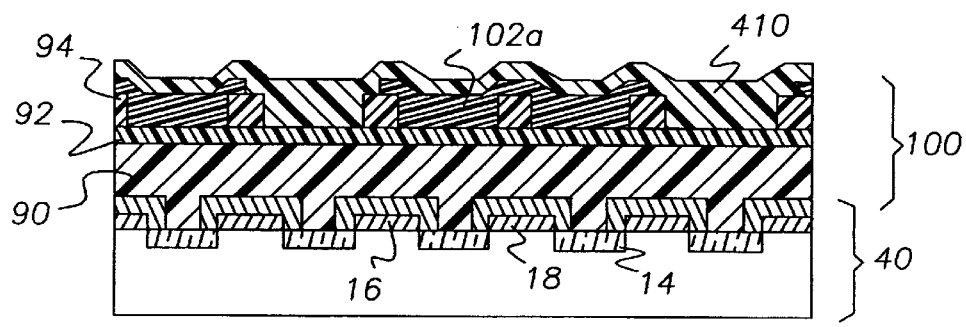
Figure 3I:
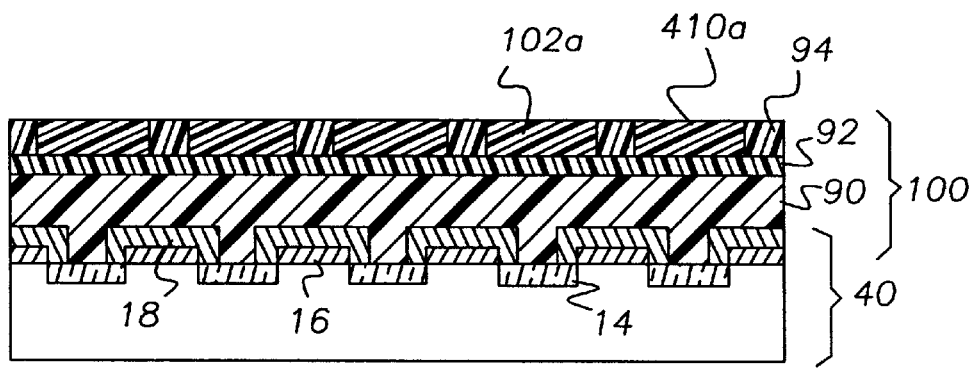
Figure 3J:
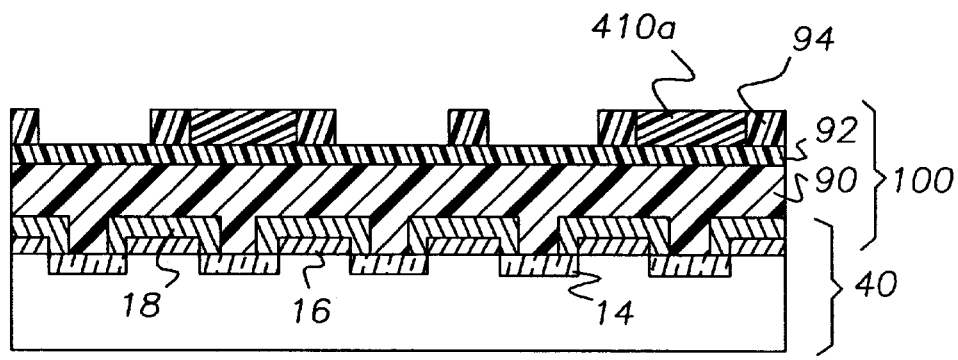

Next, as shown in FIG. 3F, after removal of photoresist 96 another conventional photoresist layer 102 is coated on the surface 101 and in the openings 108 preferably by spin coating. Photoresist 102 is preferably positive working which means that the unexposed areas remain after the subsequent development step. The thickness of the photoresist 102 should be equal to or slightly greater than the depth of the upper support layer 94. This is followed by masking, exposing, and developing a pattern in photoresist 102 conforming to the desired pattern of the first color filter element. This results in openings 108a shown in FIG. 3G. Next, as shown in FIG. 3H, the first color filter layer 410 is coated on top of the patterned photoresist 102a and in the openings 108a, preferably by spin coating. The thickness of the first color filter layer 410 should be equal to or slightly greater than the depth of the upper support layer 94 in the openings 108a. The next step in this embodiment is to make the surfaces of the upper support layer 94, the patterned photoresist 102a, and the first color filter layer 410 coplanar as is shown in FIG. 3I. This is accomplished using chemical mechanical planarization. As a result, areas of the first color filter layer 410 that were over patterned photoresist 102a and upper support layer 94 are completely removed leaving the first color filter layer 410 only in the openings 108a. This gives the pattern of the first color filter element 410a. The patterned photoresist 102a is then removed by an unpatterned exposure and development as is shown in FIG. 3J. This first color filter element pattern 410a is then subjected to a hardening treatment, preferably elevated temperature, so that it will be-resistant to further processing.

The chemical mechanical polishing (CMP) process includes moving the sample surface to be polished against a pad and running slurry between the sample surface and pad to affect the polishing. Abrasive particles in the slurry cause mechanical damage on the sample surface, loosening the material for enhanced chemical attack or fracturing off the pieces of surface into the slurry where they dissolve or are swept away. The process is tailored to provide enhanced material removal rate from high points on surfaces (compared to low areas), thus affecting the planarization.

The pad is generally composed of polyurethane with a filler material to control hardness. The chemical and physical structures of the pad are important factors in the channeling of slurry between the pad and sample. The slurry contains an abrasive usually silica($SiO_2$) or alumina ($Al_2O_3$) but ceria ($CeO_2$), titania ($TiO_2$), magnesium oxide (MgO), zirconia ($ZrO_2$), rouge ($Fe_3O_4$), and hafnia ($HfO_2$) have also been used depending on the particular materials being polished. It is important to control the pH of the slurry with buffering agents and other chemical agents such as oxidizers, complexing agents, and surfactants may also be necessary to insure the proper chemical action and stability of the slurry.

There are vendors available to supply both the consumables (pads and slurries) and equipment necessary to do chemical mechanical polishing. Consumables are available from Rodel, Inc., Cabot Corp., Engis Corp., and Praxair Surface Technologies among others. Polishing equipment vendors include Westech, IPEC-Planar, Strasbaugh, Speedfam, Siltec, Lapmaster, On-Trac, and Logitech.

Figure 3K:
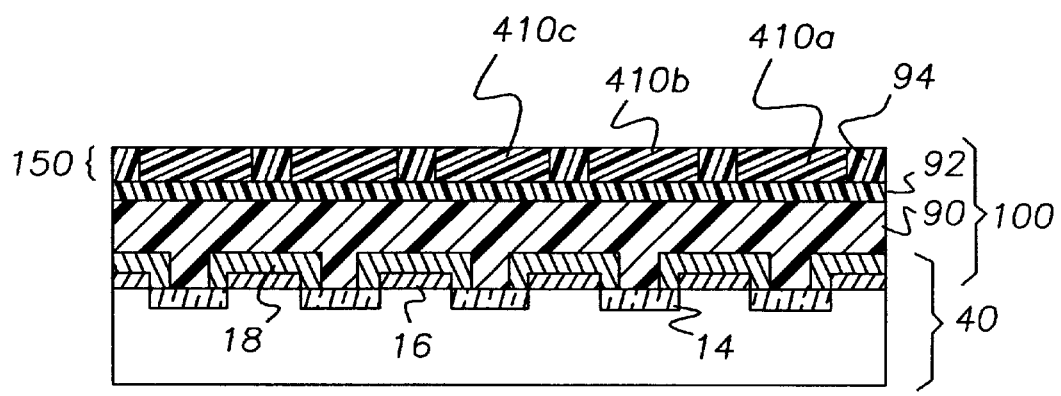

A color filter array of more than one color can be made using this embodiment by now repeating the above mentioned steps in FIGS. 3F through 3J until all the openings 108 are filled with color filter elements in the desired pattern of different colors. An example of an embedded, planar color filter array 150 made with this embodiment and consisting of three color filter elements 410a, 410b, and 410c is shown in FIG. 3K.

A second preferred embodiment for making an array of color filter elements embedded in a support layer made in accordance with this invention is next described. The object of this method being to reduce the number of processing steps. This is accomplished by formulating the color filter layers to be photopatternable and thus eliminate the need for separate coating and patterning of conventional positive photoresist before the coating of each individual color filter layer. It is recognized that this increases the performance demands on the color filter layers but provides significant processing cost reduction within the scope of this invention if such performance demands can be met.

Figure 4A:
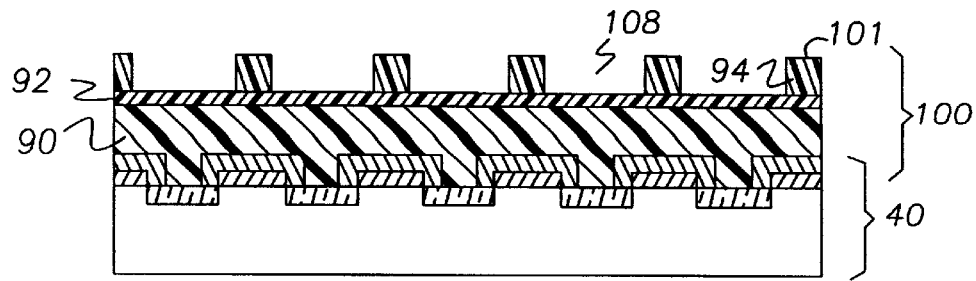
FIGS. 4A–4E show cross-sectional views in various stages of making a color filter array in accordance with a second embodiment of this invention.

Referring to FIG. 4A, as in the previous embodiment a support layer 100 having a surface 101, which has been optically planarized by chemical mechanical polishing so that light is refracted as expected from an ideal flat dielectric surface, is provided over semiconductor portion 40 of a solid state imager. Support layer 100 may be a single layer of transparent dielectric material such as an oxide deposited by chemical vapor deposition and optically planarized by chemical mechanical polishing, or support layer 100 may comprise a trilayer structure consisting of a lower transparent layer 90, preferably an oxide deposited by chemical vapor deposition and optically planarized, an etch-stop layer 92, preferably a thin layer of nitride or polysilicon deposited by plasma enhanced CVD, and an upper support layer 94, preferably an oxide deposited by chemical vapor deposition, as was the case for support layer 100 discussed in the previous embodiment. Where like parts correspond, the same numbers are used in the remaining figures.

In FIG. 4A, openings 108 are formed by patterning conventional photoresist and etching the upper support layer 94 of support layer 100 anisotropically, preferably by reactive ion etching so that the sidewalls of openings 108 are substantially vertical. The etch may proceed to an etch-stop layer 92 as in the case of the previous embodiment, or the etch may be timed to achieve a depth dependent on the etch rate but independent of the image sensor structure. The depth of the etch is selected to be equal to the desired thickness of the color filter elements.

Figure 4B:
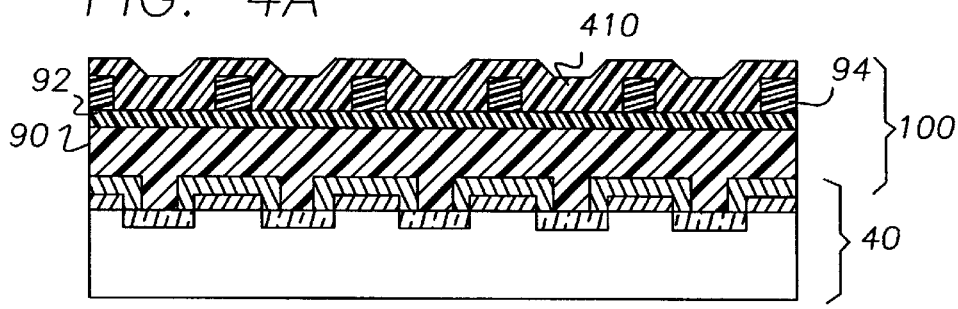
Figure 4C:
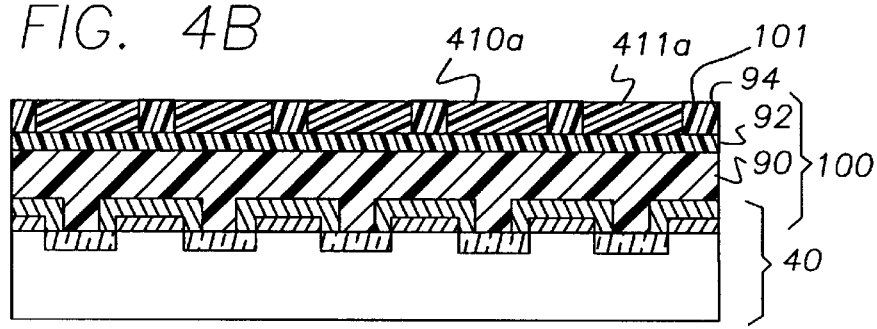
Figure 4D:
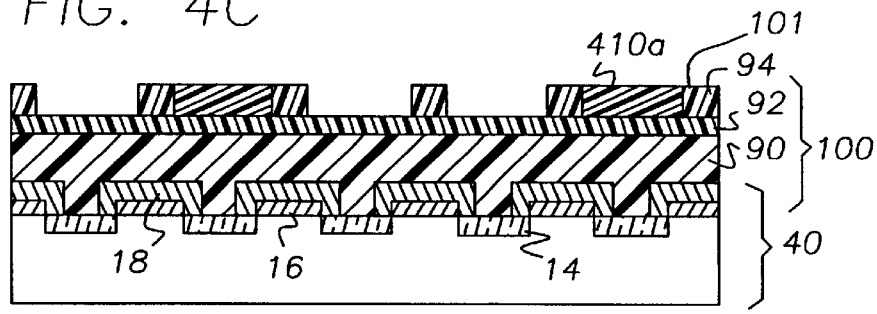

Next, as shown in FIG. 4B, it is desired to coat first color filter layer 410 over the structure to a thickness at least sufficient to entirely fill openings 108. First color filter layer 410 may be spin-coated in the preferred case that it is a colorant contained within a photopolymer solution. First color filter layer 410 is then removed from surface 101, preferably by chemical mechanical polishing as shown in FIG. 4C. The surfaces 410a of first color filter elements 410a are shown substantially coplanar with the surface 101 of support layer 100. The first embedded color filter elements 410a, consisting of a colorant contained within a photoactive polymer, are then exposed to electromagnetic radiation of wavelength suitable to cause a chemical change in the photoactive polymer. Masking technology known to those skilled in the art is used to allow the electromagnetic radiation to strike only those first embedded color filter elements 410a desired to form the pattern of the first color. The chemical change caused by the radiation allows those first embedded color filter elements 410a not needed for the pattern of the first color to be removed by development. The result is a set of first embedded color filter elements contained within openings 108a corresponding to the pattern of the first color of the color filter array as is shown in FIG. 4D. If needed to prevent interactions with subsequent color filter layers, further treatment to harden the first embedded color filter elements 410a can be performed at this point. Such treatment could be heat or light capable of further polymerizing or crosslinking the photopolymer.

Figure 4E:
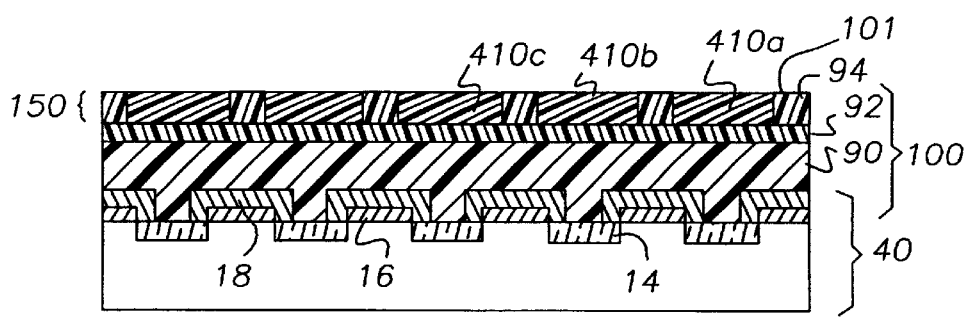

Color filter arrays containing multiple colors are achieved by repeating the coating and patterning steps shown in FIGS. 4B through 4D the same number of times as the number of different colors desired. This results in an embedded, planar color filter array 150 illustrated in FIG. 4E with three separate color filter elements 410a, 410b, and 410c. It will be recognized that further simplification of this embodiment is possible within the scope of this invention. For example, separate planarization steps after the coating of each individual color filter layer may not be necessary depending on the coating and patterning characteristics of the color filter layers. In this case only one planarization step, preferably using chemical mechanical polishing, will be necessary after the final color filter element has been patterned to achieve a planar color filter array.

A third preferred embodiment of the present invention is illustrated in FIGS. 5A–5G. This embodiment is useful for cases where the color filter layer is photopatternable however the presence of colorant in the photopolymer reduces the ease with which it can be developed out of small features. This reduction in the clean-out ability of color filter layers is well known in the art and is especially a concern in cases where the colorant is a pigment dispersed in a photopolymer solution. This results in an inhomogeneous system which is difficult to remove from small features, especially when embedded, during, the development process.

Figure 5A:
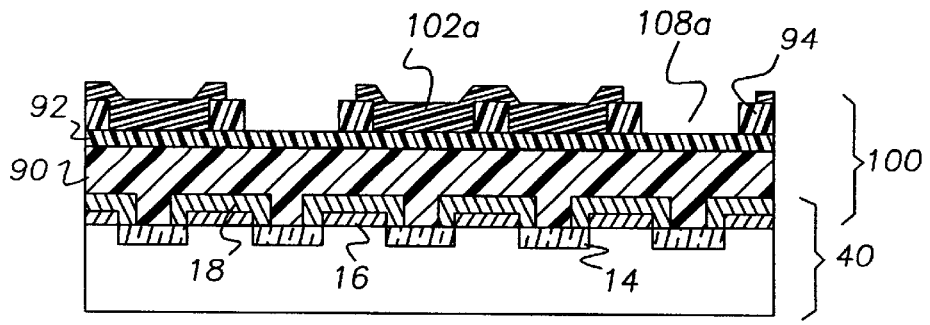
FIGS. 5A–5G. show cross-sectional views in various stages of making a color filter array in accordance with a third embodiment of this invention.
Figure 5B:
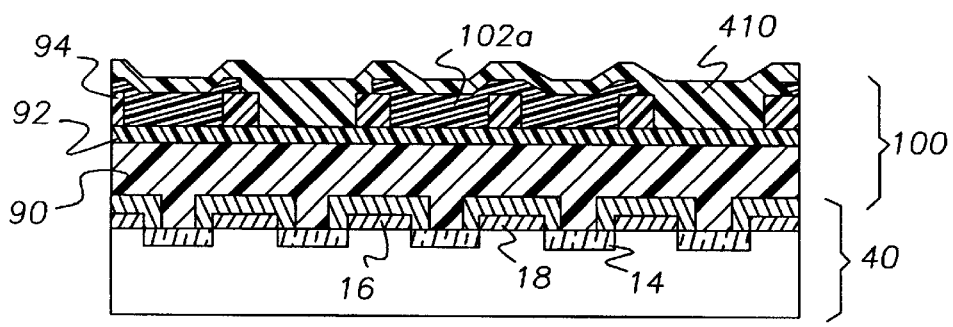
Figure 5C:
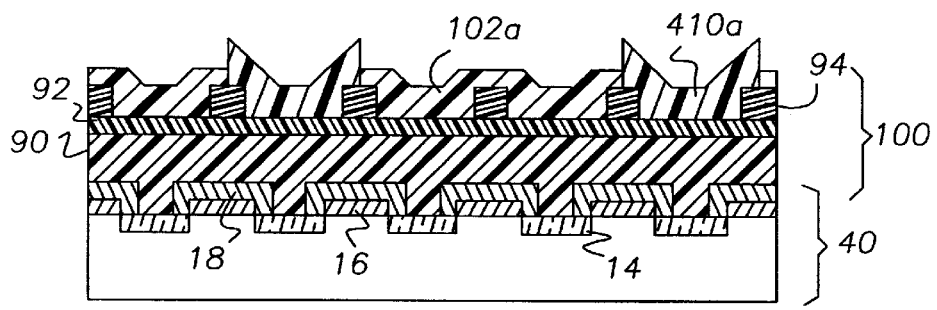

This embodiment is illustrated starting from the point at which it differs from the first embodiment. Referring to FIG. 5A, which is the same as FIG. 3G, a patterned photoresist 102a is formed as described in the first embodiment. Next, as shown in FIG. 5B, first color filter material 410 is coated, preferably by spin coating, over patterned photoresist 102a and in openings 108a. Then the first color filter material 410 is exposed to patterned electromagnetic radiation of suitable wavelength to cause a chemical change. Preferably this change would cause a hardening of the photopolymer material resulting in an increase in molecular weight. The ensuing development would then remove those areas of color filter material 410 that were not exposed to the electromagnetic radiation. The result is shown in FIG. 5C where those areas of color filter material 410 which were over the patterned photoresist 102a corresponded to the unexposed areas and were removed during the development process. This results in the first color filter element 410a. Next, as shown in FIG. 5D, the surfaces of the first color filter element 410a, the patterned photoresist 102a, and the upper support layer 94 are made coplanar preferably by chemical mechanical polishing.

It should be appreciated by those skilled in the art the preference for color filter material that hardens upon exposure to electromagnetic radiation. Those areas of color filter material 410 that were exposed and remain as the first color filter element 410a are the same areas that were exposed during the patterning of positive photoresist 102. Thus the remaining photoresist pattern 102a has not been exposed to any electromagnetic radiation up to this point of suitable wavelength to cause any chemical change and remains photoactive. This remaining photoactivity permits the removal of those parts of patterned photoresist 102a not needed as a mask for the second color filter layer. Since positive photoresists are known for high resolution patterning capability complete removal from openings 108 occurs leaving no residue to interfere with the color characteristics of the color filter array. Whereas if the addition of colorant to the photopolymer in the color filter layer 410 reduces its patterning ability then complete clean-out of the openings 108 may not occur.

The amount of hardening that has occurred in the first color filter element 410a will determine how the patterned photoresist 102a is removed. If the hardening is sufficient to withstand any penetration by the subsequent application of other color filter layers then patterned exposure of patterned photoresist 102a is used. This exposure to electromagnetic radiation of wavelength suitable for causing a chemical change in patterned photoresist 102a making it more soluble in the development solvent is (lone only in those areas corresponding to the desired pattern of the second color filter element. This results in a patterned photoresist 102b and openings 108b as shown in FIG. 5E. Repeating the steps shown in FIGS. 5B–5 for a second and third color filter material results in an embedded, planar color filter array 150 as shown in FIG. 5F with color filter elements 410a, 410b, and 410c.

Figure 5D:
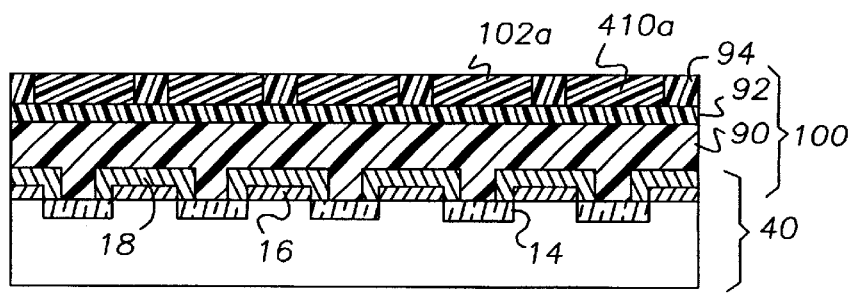
Figure 5E:
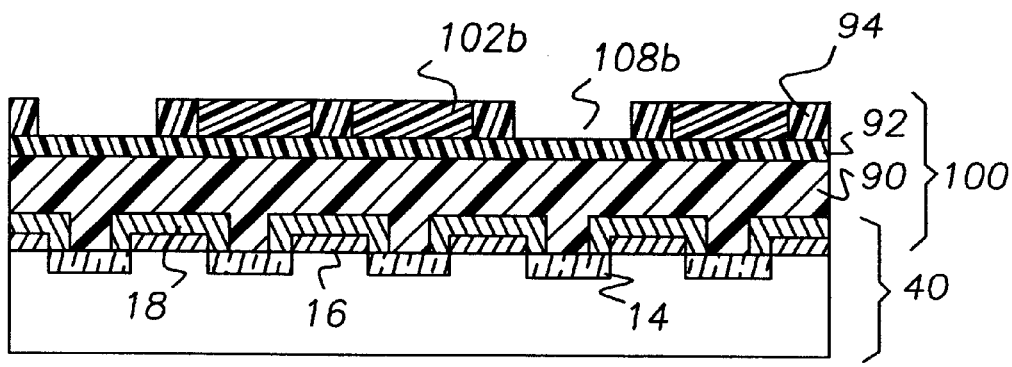
Figure 5F:
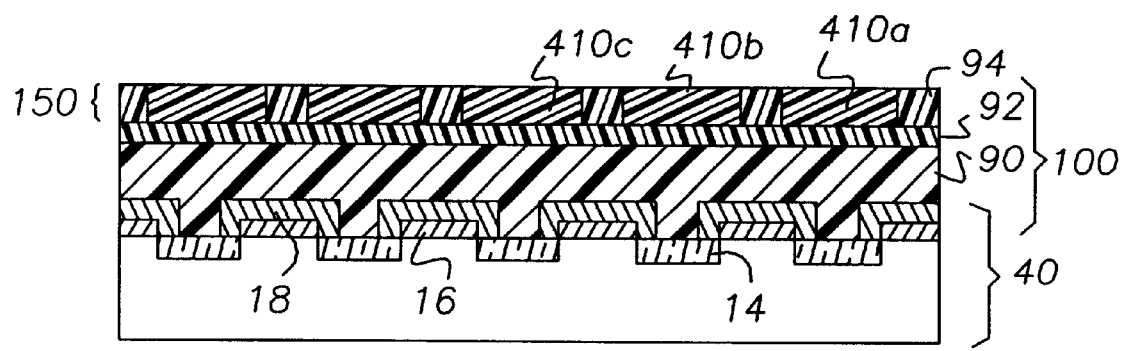
Figure 5G:
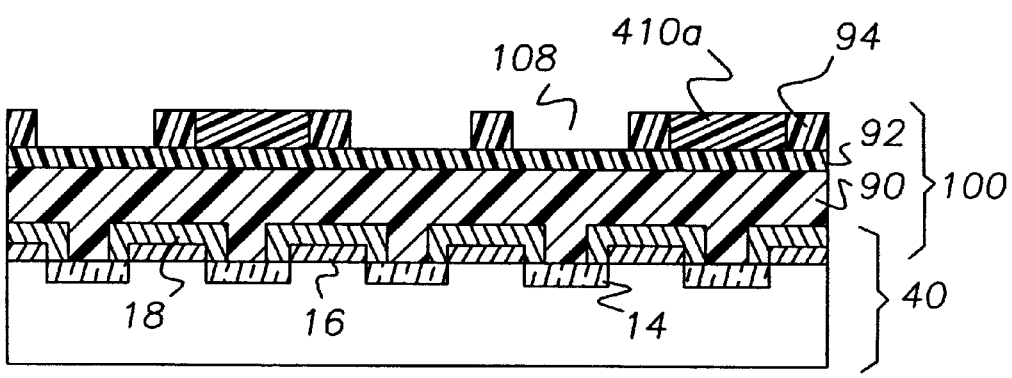

If the hardening of the first color filter element 410a that occurs during the patterning of the first color filter layer 410 in FIG. 5C is not sufficient to prevent an interaction with subsequent color filter layers then the entire patterned photoresist 102a in FIG. 5D needs to be removed. This is accomplished by doing an unpatterned exposure followed by development and results in only the first color filter element 410a remaining in openings 108 corresponding to the desired pattern of the first color element as shown in FIG. 5G. It is then required to repeat the steps illustrated in FIGS. 5A–5D and FIG. 5G for a second and third color filter material to result in the same embedded, planar color filter array 150 in FIG. 5F.

It is to be recognized that simplifications of this embodiment are possible within the scope of this invention. One such simplification is to not use chemical mechanical polishing as shown in FIG. 5D until all the color filter layers have been patterned. This will reduce the number of processing steps and will be possible if all color filter layers are coated to a thickness of at least thickness of the upper support layer 94.but not too thick as to cause excessive topography. Another simplification is possible with judicious choice, of the photopolymer for the color filter layers. Positive photoresist that has not been exposed remains soluble in a variety of organic solvents. Thus, if the unexposed photopolymer used in the color filter layers is also soluble in such an organic solvent then development of the color filter element pattern will also result in the removal of the positive photoresist pattern 102a in FIGS. 5C or 5D. This results in the structure shown in FIG. 5G without the need for the unpatterned exposure and development of the positive photoresist pattern 102a.

It is to be appreciated that while this invention has been described in terms of certain preferred embodiments, there are mainly variations and combinations of these embodiments including variants of materials selected which are obvious to those skilled in the art and which are equally within the scope and spirit of this invention.

In particular, materials other than those described in the preferred embodiments may be used to accomplish like functions as would be obvious to one skilled in the art. For example, in another preferred embodiment, the lower transparent layer 90 and upper support layer 94, are preferably a spin on glass such as an oxide glass. In another preferred embodiment, etch-stop layer 92 is opaque and has different etching characteristics than lower transparent layer 90. Thus it may be entirely removed from lower transparent layer 90 by selective etching just prior to coating each color filter layer. Still another embodiment would have the etch-stop layer 92 transparent but have different etching characteristics than the lower transparent layer 90. This would allow a second thickness for the color filter elements if needed by removing the etch-stop layer 92 for some color filter elements and not for others.

In yet another preferred embodiment, the upper support layer 94 can be made opaque in order to limit light scatter between adjacent color filter elements, preferably chosen from the group tungsten, tungsten silicide, aluminum, titanium, titanium nitride, or other refractory metals.

The invention has been described in detail with particular reference to certain preferred embodiments thereof, but it will be understood that variations and modifications can be effected within the spirit and scope of the invention.

PARTS LIST 10 pixel
12 semiconductor substrate
14 photosensitive regions
16 electrode
18 light shield
20a partially planarizing layer
20b upper planarizing layer
22 lens
24a color filter element
24b color filter element
26a color filter element
26b color filter element
40 semiconductor portion
60 region
92 region
90 transparent layer
91 optically planar surface
92 transparent etch-stop layer
94 support layer
96 photoresist
100 support layer
101 surface
102 photoresist layer
102a patterned photoresist
102b patterned photoresist
108 opening
108a opening
108b opening
150 planar color filter array
Parts List cont'd
410 color filter layer
410a first color filter element
410b second color filter element
410c third color filter element
411a surface

What is claimed is:

1. A method of making a solid state image sensor having a color filter array with color filter elements having a plurality of different types of colored pixels embedded in a planar surface, the method comprising the steps of:
    (a) providing a semiconductor substrate having spaced image pixels with a first transparent layer covering the pixels;
    (b) making the first transparent layer optically planar by chemical mechanical polishing;
    (c) uniformly depositing a second transparent etch-stop layer over the first transparent layer;
    (d) uniformly depositing a third support layer over the second transparent etch-stop layer which is made of a different material than the second transparent etch-stop layer;
    (e) etching openings into the third support layer in regions where all color filter elements are desired to be formed; and
    (f) sequentially filling each opening with one of two or more colorants to form the color filter array.

2. The method of claim 1 wherein the sequential filling step includes:
    (i) forming a layer of photoresist material in the openings and over the second transparent etch-stop layer;
    (ii) patterning openings in the photoresist layer corresponding to color filter elements of the first color;
    (iii) coating a matrix having a colorant which defines a first color;
    (iv) removing the matrix coating except for where it is in openings on the second transparent etch-stop layer; and
    (v) repeating steps (ii)–(iv) to form one or more different colors in different color filter elements to complete the color filter array.

3. The method of claim 1 wherein the colorants are pigments dispersed in a photosensitive matrix and the sequential filling step includes:
    (i) forming a layer of the photosensitive matrix in the openings and over the second transparent etch-stop layer;
    (ii) exposing those portions of the photosensitive matrix necessary to define color filter elements of a first color in the color filter array;
    (iii) removing those portions of the photosensitive matrix which do not correspond to the color filter elements of the first color in the color filter array; and
    (iv) repeating steps (i)–(iii) to form one or more different colors in different color filter elements to complete the color filter array.

4. A method of making a solid state image sensor having a color filter array with color filter elements having a plurality of different types of colored pixels embedded in a planar top surface, the method comprising the steps of:
    (a) providing a semiconductor substrate having spaced image pixels with a first transparent layer covering the pixels;

(b) making the first transparent layer optically planar by chemical mechanical polishing;

(c) uniformly depositing a second transparent etch-stop layer over the first transparent layer, (d) uniformly depositing a third support layer over the second transparent etch-stop layer which is made of a different material than the second transparent etch-stop layer;

(e) etching openings into the third support layer in regions where color filter elements are desired to be formed;

(f) conformably coating a photoresist layer in the openings on the top surface of the second transparent etch-stop layer and on the top surface of the third support layer;

(g) patterning the photoresist layer to remove portions of the photoresist layer corresponding to the first type of colored pixels;

(h) coating the photoresist layer and the second transparent etch-stop layer in the patterned opening portions with color filter material of the first color type corresponding to the first type of colored pixels;

(i) removing the first type of color filter material from positions where it was coated over the photoresist layer; and (j) repeating the sequence of steps (g), (h), and (i) a desired number of times using different types of color filter materials to form the desired types of color filter elements thereby completing the color filter array and planarizing the top surface of the color filter array.

5. The method of claim 4 wherein the first and third transparent layers are formed of the same material.

6. The method of claim 4 wherein step (i) includes chemical mechanical polishing of the color filter material so that the first type of color pixel is coplanar to the top surface of the third support layer.

7. The method of claim 4 wherein the color filter material is photopatternable and step (i) includes exposure and development steps for removing the color filter material in those areas where it is over the photoresist layer.

8. A method of making a solid state image sensor having a color filter array with color filter elements having at least three different types of colored pixels embedded in a planar top surface, the method comprising the steps of:

(a) providing a semiconductor substrate having spaced image pixels with a first transparent layer covering the pixels;

(b) making the first transparent layer optically planar by chemical mechanical polishing;

(c) uniformly depositing a second transparent etch-stop layer over the first transparent layer, (d) uniformly depositing a third support layer over the second transparent etch-stop layer which is made of a different material than the second transparent etch-stop layer;

(e) etching openings into the third support layer in regions where color filter elements are desired to be formed;

(f) conformably coating a photoresist layer in the openings on the top surface of the second transparent etch-stop layer and on the top surface of the third transparent layer;

(g) patterning the photoresist layer to remove portions of the photoresist layer corresponding to the first type of colored pixels;

(h) coating the photoresist layer and the second transparent etch-stop layer in the patterned opening portions with color filter material of the first color type corresponding to the first type of colored pixels;

(i) removing the first type of color filter material from positions where it was coated over the photoresist layer;

(j) hardening the first type of color filter material making it resistant to interaction between subsequently deposited color filter materials; and (k) repeating the sequence of steps (g), (h), (i) and (j) at least two times using different types of color filter materials to form the desired types of color filter elements thereby completing the color filter array and planarizing the top surface of the color filter array.

9. The method of claim 8 herein the first transparent layer and the third support layers are formed of the same material.

10. The method of claim 8 wherein step (i) includes chemical mechanical polishing of the color filter material so that the first type of color pixel is coplanar to the top surface of the third support layer.

11. The method of claim 8 wherein the color filter material is photopatternable and step (i) includes exposure and development steps for removing the color filter material in those areas where it is over the photoresist layer.

* * * * *